United States Patent
Yang et al.

(10) Patent No.: US 8,588,353 B2
(45) Date of Patent: Nov. 19, 2013

(54) FREQUENCY SELECTIVE IQ CORRECTION

(75) Inventors: Zigang Yang, Plano, TX (US); Lars Jorgensen, Royal Oaks, CA (US); Lei Ding, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 13/078,363

(22) Filed: Apr. 1, 2011

(65) Prior Publication Data
US 2012/0250790 A1  Oct. 4, 2012

(51) Int. Cl.
*H04B 1/10* (2006.01)

(52) U.S. Cl.
USPC ........... 375/350; 375/295; 375/296; 375/297; 375/316; 375/346; 455/63.1; 455/67.13; 455/114.2; 455/296; 455/501; 370/335; 370/342; 329/315; 329/318; 329/319; 329/320; 329/347; 327/551

(58) Field of Classification Search
USPC ................. 375/295, 296, 297, 316, 346, 350; 455/63.1, 67.13, 114.2, 296, 501; 370/335, 342; 329/315, 318, 319, 320, 329/347; 327/551
See application file for complete search history.

(56) References Cited

U.S. PATENT DOCUMENTS

| | | | |
|---|---|---|---|
| 5,644,596 A | 7/1997 | Sih | |
| 6,681,103 B1 | 1/2004 | Rogers et al. | |
| 8,160,191 B2 * | 4/2012 | Row et al. | 375/350 |

FOREIGN PATENT DOCUMENTS

WO    WO02082673    10/2002

OTHER PUBLICATIONS

"Frequency-Selective I/Q Mismatch Calibration of Wideband Direct-Conversion Transmitters," IEEE Transactions on Circuits and Systems—II (Special Issue on Multifunctional Circuits and Systems for Future Generations of Wireless Communications), vol. 55, Apr. 2008, pp. 359-363 (Anttila, et al.).
U.S. Appl. No. 12/648,898, filed Dec. 29, 2009.

* cited by examiner

*Primary Examiner* — Leon Flores
(74) *Attorney, Agent, or Firm* — Alan A. R. Cooper; W. James Brady, III; Frederick J. Telecky, Jr.

(57) ABSTRACT

In conventional radio frequency (RF) systems, transmitters will usually convert baseband signals to RF so as to be transmitted. As part of the conversion process, the transmitters will perform digital predistortion (DPD), which uses feedback from a power amplifier. However, there are usually mismatches between the in-phase (I) and quadrature (Q) paths within with feedback loop. Traditional IQ correction filters were ineffective at providing adequate compensation for these mismatches, but here a filter is provided that provides adequate out-of-band compensation by use of frequency selectivity.

11 Claims, 6 Drawing Sheets

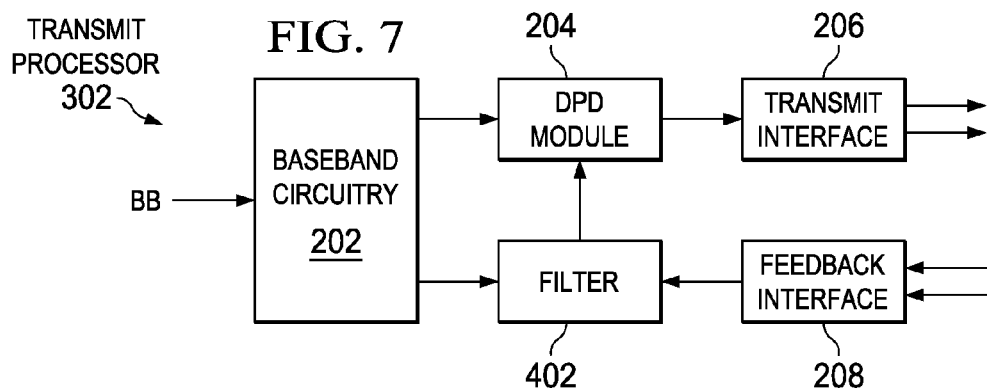
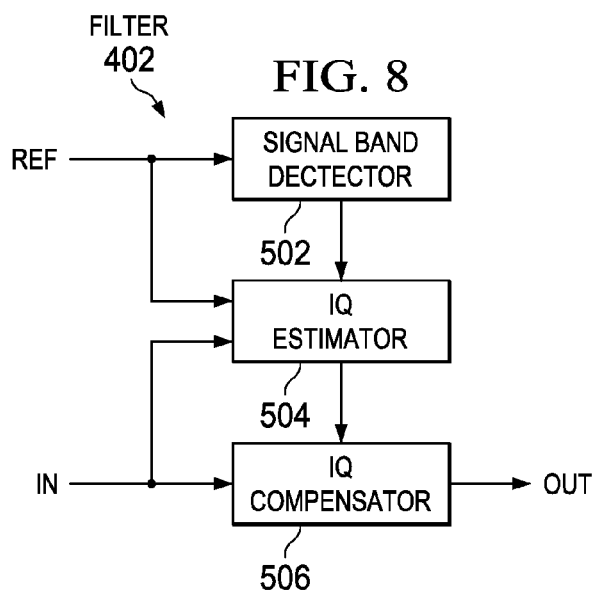

FREQUENCY SELECTIVE IQ CORRECTION

TECHNICAL FIELD

The invention relates generally to in-phase (I) and quadrature (Q) correction and, more particularly, to IQ correction in the feedback path of a digital predistortion (DPD) system.

BACKGROUND

Turning to FIG. 1, a conventional transmitter 100 can be seen. In operation, the transmitter 100 is able to convert the baseband signal BB to radio frequency (RF) so as to be transmitted over the transmit circuitry. As part of the conversion process, the transmit processor 102 can perform crest factor reduction (CFR), digital upconversion, DPD, and other processes on the baseband signal BB in the digital domain so as to generate digital I and Q signals. These digital I and Q signals are then converted to analog I and Q signals by digital-to-analog converters (DACs) 104-1 and 104-2 so as to generate analog signals for the modulator (i.e., mixers 108-1 and 108-2 and phase adjuster 110-1 that receives a local oscillator signal by local oscillator (LO) 112). The modulator then generates the RF signal for power amplifier (PA) 114. This PA 114, however, is nonlinear, so the transmit processor's 102 DPD correction allows for the signal to be predistorted in baseband to compensate for nonlinearities in the PA 114.

To perform this DPD correction, transmit processor employs a feedback system, namely feedback circuitry. The feedback circuitry generally comprises analog-to-digital converters (ADCs) 106-1 and 106-2 and a demodulator (which includes mixers 108-3 and 108-4 and phase adjuster 110-2 that receives a local oscillator signal from LO 112). Typically, the demodulator is able to demodulate the RF output from the PA 114 to generate analog I and Q feedback signals, which are then converted to digital I and Q signals by ADCs 106-1 and 106-2.

Turning to FIGS. 2 and 4, examples of the transmit processor 102-1 can be seen in greater detail. As shown, the transmit processor 102-1 (for FIG. 2) or 102-2 (for FIG. 4) generally includes baseband circuitry 202 (which can perform CFR and as well as other tasks), a DPD module 204 (which can either be hardware or software embodied on a processor and memory and which performs the DPD correction), transmit interface 206 (which provides the digital and Q transmit signals to the transmit circuitry), feedback interface 208 (which receives digital I and Q feedback signals from the feedback circuitry), and a filter 210-1 (for FIG. 2) or 210-2 (for FIG. 4). Generally, because there are differences between the mixers 108-3 and 108-4 (as well as other circuitry), there is usually a mismatch between the I and Q paths, and filter 210-1 or 210-4 is intended to compensate for this mismatch. Additionally, for these examples it can be assumed that any IQ mismatch in the transmit path has been corrected or that an image in the transmit path is outside of the band-of-interest.

Looking first to filter 210-1, the filtering scheme is inadequate. The aligned feedback signal y(n) can be represented as:

$$y(n)=h_1(n)*x(n)+h_2(n)*x^*(n)+v(n), \quad (1)$$

where x(n) is a reference signal, $h_1(n)$ is the time domain channel response of the combined transmit and feedback circuits, $h_2(n)$ is the time domain channel response due to the IQ distortion, and v(n) is the measurement error including nonlinearity and noise. Each of these channel responses $h_1(n)$ and $h_2(n)$ can be easily estimated from measurements data using a least square algorithm, so filter 210-1 can be constructed as follows:

$$z(n)=y(n)+h_{corr}(n)*y^*(n), \quad (2)$$

where z(n) is the output from filter 210-1 and $h_{corr}(n)$ is the correction. Specifically, this filter 210-1 attempts to eliminate the conjugate of the reference signal x*(n) (which generally corresponds to an image) in equation (1), so, when equation (1) is substituted into equation (2), equation (2) becomes:

$$z(n)=h_1(n)*x(n)+h_2(n)*x^*(n)+v(n)+h_{corr}(n)*[h_1^*(n)*x^*(n)+h_2^*(n)*x(n)+v^*(n)] \quad (3)$$

Performing a Fourier transform on equation (3), it then becomes:

$$\mathcal{F}\{z(n)\} = H_1(f) \cdot X(f) + H_2(f) \cdot X^*(-f) + V(f) + \quad (4)$$
$$H_{corr}(f)[H_1^*(-f) \cdot X^*(-f) + H_2^*(-f) \cdot X(f) + V^*(-f)]$$
$$= [H_1(f) + H_2^*(-f)] \cdot X(f) + [H_2(f) + H_1^*(-f) \cdot H_{corr}(f)] \cdot$$
$$X^*(-f) + V(f) + H_{corr}(f) \cdot V^*(-f)$$

and the optimal solution to get ride of the image signal X*(−f) is:

$$H_{corr}(f) = \frac{-H_2(f)}{H_1^*(-f)} \quad (5)$$

Thus, the correction $h_{corr}(n)$ is:

$$h_{corr}(n) = \mathcal{F}^{-1}\left\{\frac{-H_2(f)}{H_1^*(-f)}\right\} \approx \overline{W^{-1}} \cdot \frac{-H_2(f)}{H_1^*(-f)}, \quad (6)$$

where $\overline{W^{-1}}$ is the inverse discrete Fourier transform matrix. When this filter 210-1, however, is applied (for example) to a 6-carrier system, the filter 210-1 is ineffective at eliminating or even substantially reducing the image (as shown in FIG. 3). A reason for this error is that the estimation of channel responses $h_1(n)$ and $h_2(n)$ are inaccurate in the out-of-band region due to a lack of constraints within this region. Additionally, when the inverse discrete Fourier transform matrix $\overline{W^{-1}}$ is used, the time domain filter should to match the frequency domain filter for all frequency points, either in-band or out-of-band. In-band frequency points are well defined, but out-of-band frequency points are simply random because no information is available, indicating that filter 210-1 is not generally accurate.

Now turning to filter 210-2 of transmit processor 102-2 of FIG. 4, this filter 210-2, too, is inadequate. For this filter 210-2, it uses the following alternative construction:

$$z(n)=h_1^*(n)*y(n)-h_2(n)*y^*(n), \quad (7)$$

Similar to filter 210-1, filter 210-2 attempts to eliminate the conjugate of the reference signal x*(n) (which generally corresponds to an image X*(−f)) in equation (1); however, this approach does not employ the use of a correction (i.e., $h_{corr}(n)$). When this filter 210-1, however, is applied (for example) to a 6-carrier system, the filter 210-2 is effective at reducing the image (as shown in FIG. 4), but a substantial out-of-band ripple is introduced.

Thus, there is a need for an improved IQ compensation filter.

Some other conventional designs are: U.S. Pat. No. 5,644,596; and 6,681,103; PCT Publ. No. WO2002/082673; U.S. patent application Ser. No. 12/648,898; and Anttila et al., "Frequency-selective I/Q mismatch calibration of wideband direct conversion transmitters," *IEEE Trans. Circuits and Systems II* (Special Issue on Multifunctional Circuits and Systems for Future Generations of Wireless Communications), vol. 55, pp. 359-363, April 2008.

SUMMARY

An embodiment of the present invention, accordingly, provides an apparatus. The apparatus comprises baseband circuitry; a digital predistortion (DPD) module that is coupled to receive a transmit signal from the baseband circuitry; a transmit interface that is coupled to the DPD module to receive a predistorted transmit signal; a feedback interface that is adapted to receive in-phase (I) and quadrature (Q) feedback signals; an IQ correction filter having: a signal band detector that is coupled to the receive interface to receive a reference signal from the baseband circuitry; an IQ estimator that is coupled to the receive interface to receive the I and Q feedback signals and that is coupled to the signal band detector to receive a mask, wherein the mask corresponds to the band of the I and Q feedback signals; and an IQ compensator is coupled to the receive interface to receive the I and Q feedback signals and that is coupled to the IQ estimator to receive a correction, wherein the IQ compensator applies the correction to the I and Q feedback signals so as to provide corrected I and Q feedback signals to the DPD module.

In accordance with an embodiment of the present invention, the DPD module is implement in software embodied on a processor and memory.

In accordance with an embodiment of the present invention, the IQ correction filter is implemented in software embodied on the processor and memory.

In accordance with an embodiment of the present invention, the correction is a correction function that is the product of a pseudoinverse of a sub-matrix for the band of the I and Q feedback signals of a discrete Fourier transform matrix and a subset of a frequency response indexed by the mask.

In accordance with an embodiment of the present invention, the processor is a digital signals processor.

In accordance with an embodiment of the present invention, an apparatus is provided. The apparatus comprises transmit circuitry; feedback circuitry; and a transmit processor having: baseband circuitry; a DPD module that is coupled to receive a transmit signal from the baseband circuitry; a transmit interface that is coupled to the DPD module to receive a predistorted transmit signal and that is coupled to the transmit circuitry to provide I and Q transmit signals; a receive interface that is coupled to the feedback circuitry to receive I and Q feedback signals; an IQ correction filter having: a signal band detector that is coupled to the receive interface to receive a reference signal from the baseband circuitry; an IQ estimator that is coupled to the receive interface to receive the I and Q feedback signals and that is coupled to the signal band detector to receive a mask, wherein the mask corresponds to the band of the I and Q feedback signals; and an IQ compensator is coupled to the receive interface to receive the I and Q feedback signals and that is coupled to the IQ estimator to receive a correction, wherein the IQ compensator applies the correction to the I and Q feedback signals so as to provide corrected I and Q feedback signals to the DPD module.

In accordance with an embodiment of the present invention, the I and Q feedback signals further comprises digital I and Q feedback signals, and wherein the feedback circuitry further comprises: an demodulator; a first analog-to-digital converter (ADC) that is coupled to the demodulator to receive an analog I feedback signal and that is coupled to the feedback interface to provide the digital I feedback signal; and a second ADC that is coupled to the demodulator to receive an analog Q feedback signal and that is coupled to the feedback interface to provide the digital Q feedback signal.

In accordance with an embodiment of the present invention, the I and Q transmit signals further comprise digital I and Q transmit signals, and wherein the transmit circuitry further comprises: a first digital-to-analog converter (DAC) that is coupled to the transmit interface to receive the digital I transmit signal; a second DAC that is coupled to the transmit interface to receive the digital Q transmit signal; a modulator that is coupled to the first and second DACs to receive analog I and Q transmit signals; and a power amplifier that is coupled to the modulator and the demodulator.

In accordance with an embodiment of the invention, an apparatus is provided. The apparatus comprises a demodulator that generates I and Q signals from an radio frequency (RF) signal; and an IQ correction filter that is coupled to the modulator, wherein the IQ correction filter has: a signal band detector that is coupled to the demodulator to receive a reference signal; an IQ estimator that is coupled to the demodulator to receive the I and Q signals and that is coupled to the signal band detector to receive a mask, wherein the mask corresponds to the band of the I and Q feedback signals; and an IQ compensator is coupled to the receive interface to receive the I and Q signals and that is coupled to the IQ estimator to receive a correction, wherein the IQ compensator applies the correction to the I and Q signals so as to provide corrected I and Q signals by using a sub-matrix for the band of the I and Q signals of a discrete Fourier transform matrix.

In accordance with an embodiment of the invention, the demodulator further comprises: a first mixer that receives the RF signal; a second mixer that receives the RF signal; and an adjuster that receives a local oscillator signal, that is coupled to the first mixer so as to provide a first signal that is in-phase with the local oscillator signal, and that is coupled to the second mixer so as to provide a second signal that is 90° out-of-phase with the local oscillator signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 is a diagram of an example of the transmit processor of FIG. 6;

FIG. 8 is a diagram of an example of the filter of FIG. 7; and

DETAILED DESCRIPTION

Figure 1:
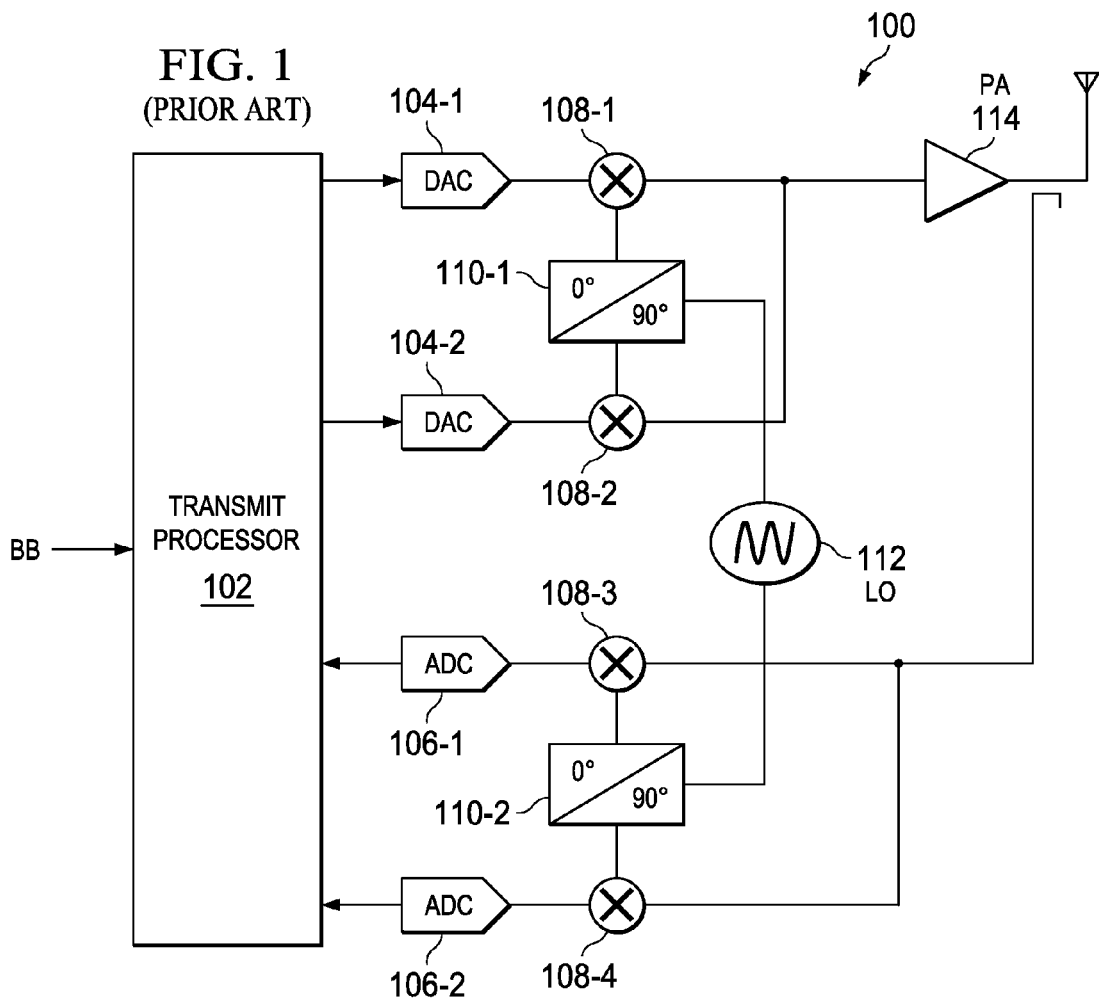
FIG. 1 is a diagram of an example of a conventional transmitter.
Figure 2:
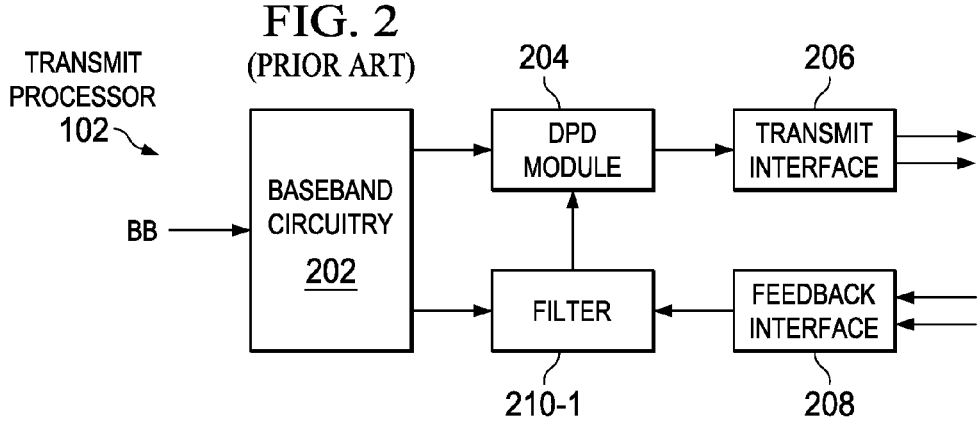
FIG. 2 is a diagram of an example of the transmit processor of FIG. 1.
Figure 3:
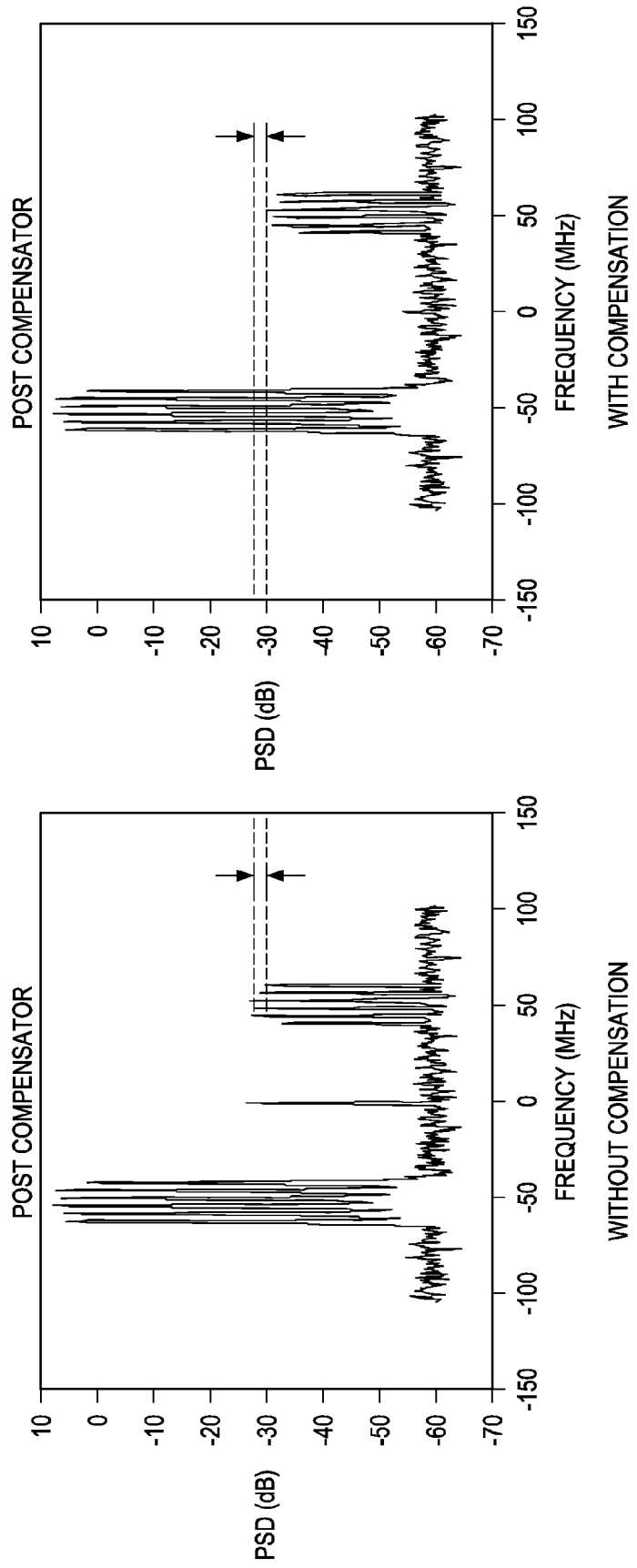
FIG. 3 is a diagram illustrating the performance of the transmitter of FIG. 1 using the transmit processor of FIG. 2.
Figure 4:
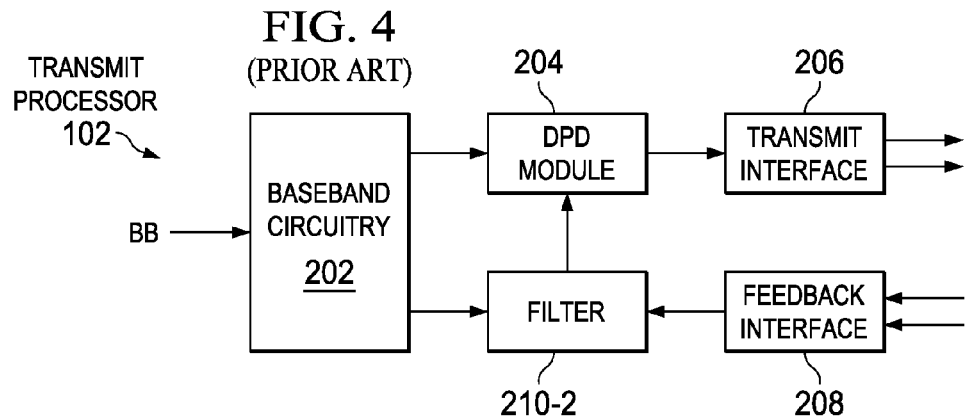
FIG. 4 is a diagram of an example of the transmit processor of FIG. 1.

Refer now to the drawings wherein depicted elements are, for the sake of clarity, not necessarily shown to scale and wherein like or similar elements are designated by the same reference numeral through the several views.

Figure 6:
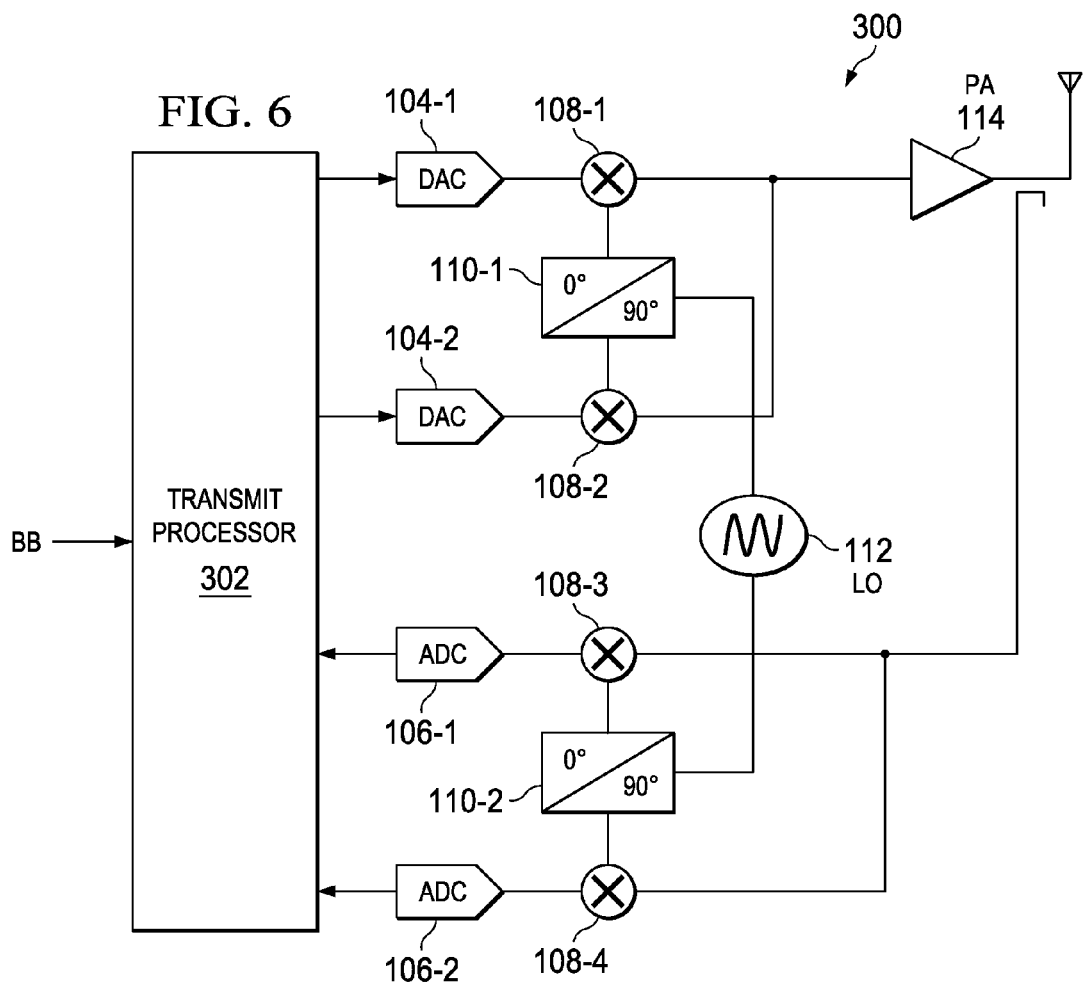
FIG. 6 is a diagram of an example of a transmitter in accordance with an embodiment of the present invention.
Figure 5:
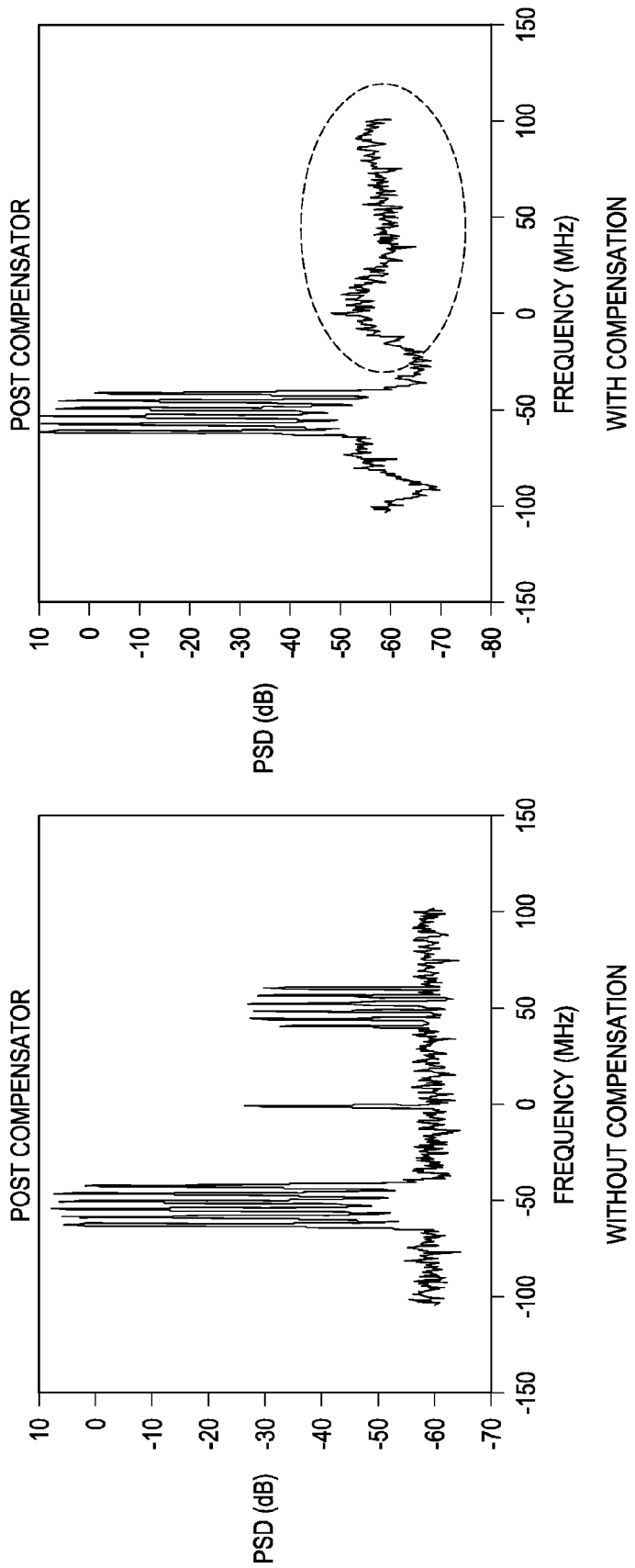
FIG. 5 is a diagram illustrating the performance of the transmitter of FIG. 1 using the transmit processor of FIG. 4.

Turning to FIGS. 6-8, an example of a transmitter 300 in accordance with an embodiment of the present invention can be seen. Transmitter 300 is similar in construction to transmitter 100, except that transmitter 300 in includes a transmit processor 302 that employs a filter 402. This filter 402 generally comprises a signal band detector 502, an IQ estimator 504, and an IQ compensator 506, where each can be hardware (circuitry) or software embodied on a processor (i.e., digital signals processor or DSP) and memory. In conventional systems, there was little to no attention to separate the signal excited band from out-of-band regions; filters (such as filter 210-1) were principally averaged to fit the whole frequency spectrum. Here, filter 402 makes adjustments based on the signal excited band so as to provide more accurate compensation for the signal excited band.

Figure 9:
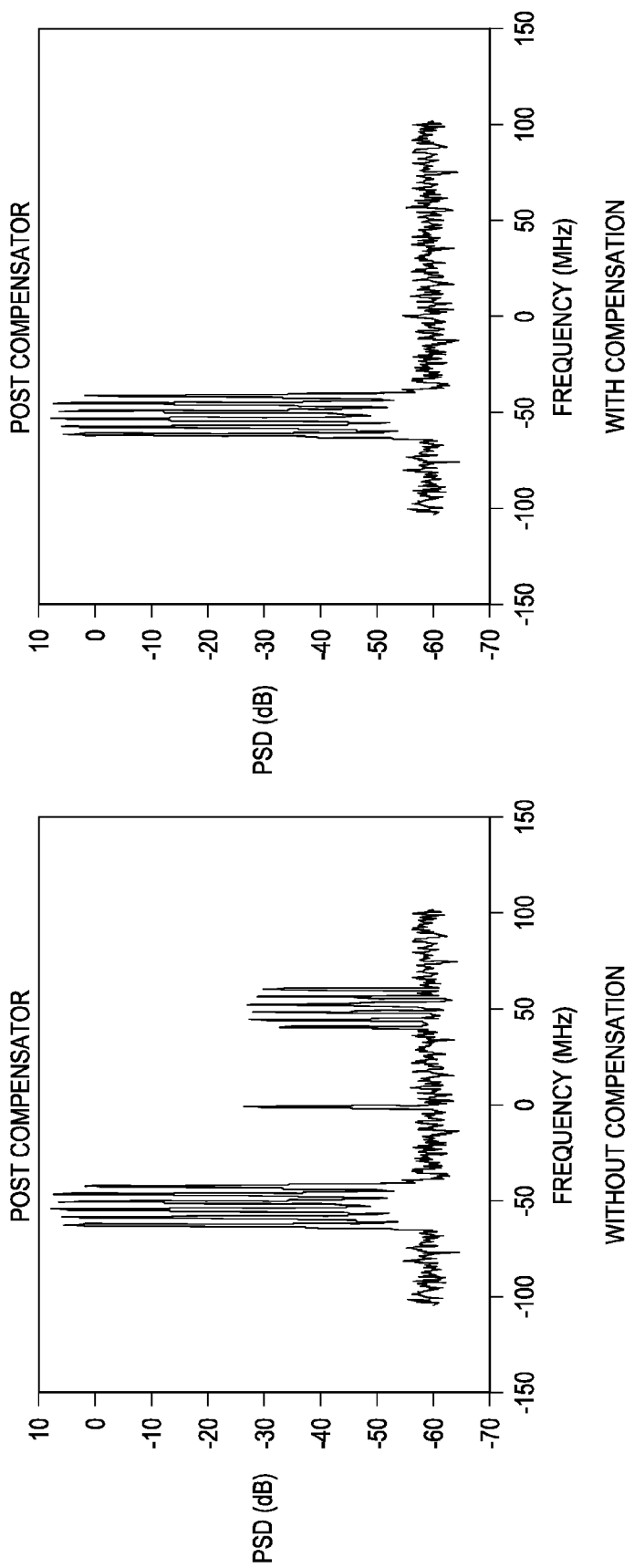
FIG. 9 is a diagram illustrating the performance of the transmitter of FIG. 6.

For filter 402, it employs the same filter construction as described in equations (2) and (5) above, but filter 402 does not use the inverse discrete Fourier transform of equation (6). Instead, IQ estimator 504 determines the correction $h_{corr}(n)$ from a mask (which is an identification of the signal excited band from reference signal REF, such as reference signal x(n) provided from the baseband circuitry 202) provided by the signal band detector 502. The IQ compensator isolates a sub-matrix $\overline{\overline{F_1}}$ of the discrete Fourier transform matrix $\overline{\overline{W}}$ indexed by the signal excited band indicated in the mask. The pseudoinverse of sub-matrix $\overline{\overline{F_1}}$ can then be used to determine the correction $h_{corr}(n)$ as follows:

$$h_{corr}(n) \approx \overline{\overline{F_1^+}} \cdot \frac{-H_2(f_1)}{H_1^*(-f_1)}, \quad (8)$$

where $f_1$ is signal excited band. This correction $h_{corr}(n)$ can then be applied to the input signal IN (i.e., y(n)) by the IQ compensator 506 to generate the output signal OUT (i.e., z(n)). As a result of using this filter 402, the image can be substantially reduced or eliminated without any additionally out-of-band errors (as shown in FIG. 9). Additionally, when the sub-matrix $\overline{\overline{F_1}}$ is employed instead of the discrete Fourier transform matrix $\overline{\overline{W}}$, the out-of-band response is not generally constrained (as with filter 210-1), which leads to a more accurate in-band response.

This filter 402 may also be applied to frequency hopping systems as well and is not limited to static systems. Multi-carrier Global System for Mobile Communications (MCGSM), for example, performs frequency hopping to different bands every 577 μs, and retraining a filter (i.e., filter 210-1) every 577 μs can become burdensome. Instead, filter 402 concatenates previous IQ compensation results for previous hopping patterns to cover the combined frequency span. To accomplish this, the signal mask detector 502 can use a retrain flag for the IQ estimator 504 so as to indicate that a frequency hopping event has occurred, and the IQ compensator 504 will update the filter as follows:

$$H_{corr}^{n+1}(f) = \begin{cases} H_{corr}^{n-1}(f), \forall f \in \text{mask} \\ H_{corr}^{n}(f), \forall f \notin \text{mask} \end{cases} \quad (9)$$

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
baseband circuitry;
a digital predistortion (DPD) module that is coupled to receive a transmit signal from the baseband circuitry;
a transmit interface that is coupled to the DPD module to receive a predistorted transmit signal;
a feedback interface that is adapted to receive in-phase (I) and quadrature (Q) feedback signals;
an IQ correction filter having:
a signal band detector that is coupled to a receive interface to receive a reference signal from the baseband circuitry;
an IQ estimator that is coupled to the receive interface to receive the I and Q feedback signals and that is coupled to the signal band detector to receive a mask, wherein the mask corresponds to the band of the I and Q feedback signals; and
an IQ compensator is coupled to the receive interface to receive the I and Q feedback signals and that is coupled to the IQ estimator to receive a correction, wherein the IQ compensator applies the correction to the I and Q feedback signals so as to provide corrected I and Q feedback signals to the DPD module,
wherein the DPD module is implement in software embodied on a processor and memory;
wherein the IQ correction filter is implemented in software embodied on the processor and memory; and
wherein the correction is a correction function that is the product of a pseudoinverse of a sub-matrix for the band of the I and Q feedback signals of a discrete Fourier transform matrix and a subset of a frequency response indexed by the mask.

2. The apparatus of claim 1, wherein the processor is a digital signals processor (DSP).

3. An apparatus comprising:
transmit circuitry;
feedback circuitry; and
a transmit processor having:
baseband circuitry;
a digital predistortion ("DPD") module that is coupled to receive a transmit signal from the baseband circuitry;

a transmit interface that is coupled to the DPD module to receive a predistorted transmit signal and that is coupled to the transmit circuitry to provide I and Q transmit signals;
a receive interface that is coupled to the feedback circuitry to receive I and Q feedback signals;
an IQ correction filter having:
   a signal band detector that is coupled to the receive interface to receive a reference signal from the baseband circuitry;
   an IQ estimator that is coupled to the receive interface to receive the I and Q feedback signals and that is coupled to the signal band detector to receive a mask, wherein the mask corresponds to the band of the I and Q feedback signals; and
   an IQ compensator is coupled to the receive interface to receive the I and Q feedback signals and that is coupled to the IQ estimator to receive a correction, wherein the IQ compensator applies the correction to the I and Q feedback signals so as to provide corrected I and Q feedback signals to the DPD module;
wherein the DPD module is implement in software embodied on a processor and memory,
wherein the IQ correction filter is implemented in software embodied on the processor and memory,
wherein the correction is a correction function that is the product of a pseudoinverse of a sub-matrix for the band of the I and Q feedback signals of a discrete Fourier transform matrix and a subset of a frequency response indexed by the mask.

4. The apparatus of claim 3, wherein the I and Q feedback signals further comprises digital I and Q feedback signals, and wherein the feedback circuitry further comprises:
an demodulator;
a first analog-to-digital converter (ADC) that is coupled to the demodulator to receive an analog I feedback signal and that is coupled to the feedback interface to provide the digital I feedback signal; and
a second ADC that is coupled to the demodulator to receive an analog Q feedback signal and that is coupled to the feedback interface to provide the digital Q feedback signal.

5. The apparatus of claim 4, wherein the I and Q transmit signals further comprise digital I and Q transmit signals, and wherein the transmit circuitry further comprises:
a first digital-to-analog converter (DAC) that is coupled to the transmit interface to receive the digital I transmit signal;
a second DAC that is coupled to the transmit interface to receive the digital Q transmit signal;
a modulator that is coupled to the first and second DACs to receive analog I and Q transmit signals; and
a power amplifier that is coupled to the modulator and the demodulator.

6. The apparatus of claim 3, wherein the processor is a DSP.

7. An apparatus comprising:
a demodulator that generates I and Q signals from an radio frequency (RF) signal; and
an IQ correction filter that is coupled to the modulator, wherein the IQ correction filter has:
   a signal band detector that is coupled to the receive interface to receive a reference signal;
   an IQ estimator that is coupled to the demodulator to receive the I and Q signals and that is coupled to the signal band detector to receive a mask, wherein the mask corresponds to the band of the I and Q feedback signals; and
   an IQ compensator is coupled to the demodulator to receive the I and Q signals and that is coupled to the IQ estimator to receive a correction, wherein the IQ compensator applies the correction to the I and Q signals so as to provide corrected I and Q signals by using a sub-matrix for the band of the I and Q signals of a discrete Fourier transform matrix.

8. The apparatus of claim 7, wherein the correction is a correction function that is the product of a pseudoinverse of the sub-matrix for the band of the I and Q signals of the discrete Fourier transform matrix and a subset of a frequency response indexed by the mask.

9. The apparatus of claim 8, wherein the IQ correction filter is implemented in software embodied on the processor and memory.

10. The apparatus of claim 9, wherein the processor is a DSP.

11. The apparatus of claim 8, wherein the demodulator further comprises:
a first mixer that receives the RF signal;
a second mixer that receives the RF signal; and
an adjuster that receives a local oscillator signal, that is coupled to the first mixer so as to provide a first signal that is in-phase with the local oscillator signal, and that is coupled to the second mixer so as to provide a second signal that is 90° out-of-phase with the local oscillator signal.

* * * * *